United States Patent [19]

Isohata et al.

[11] Patent Number: 4,601,560
[45] Date of Patent: Jul. 22, 1986

[54] FOCUS ADJUSTMENT IN AN ALIGNMENT AND EXPOSURE APPARATUS

[75] Inventors: Junji Isohata, Tokyo; Tamotsu Karasawa, Kawasaki, both of Japan

[73] Assignee: Canon Kabushiki Kaisha, Tokyo, Japan

[21] Appl. No.: 630,107

[22] Filed: Jul. 12, 1984

[30] Foreign Application Priority Data

Jul. 18, 1983 [JP] Japan ............................. 58-129391

[51] Int. Cl.4 ............................................. G03B 27/34
[52] U.S. Cl. .................................... 353/122; 353/121; 353/101; 353/28; 33/180 R
[58] Field of Search ........................ 355/52, 53, 54, 41; 356/399, 400, 401, 101; 33/180 R; 353/101, 28, 122, 121

[56] References Cited

U.S. PATENT DOCUMENTS

| | | | |
|---|---|---|---|
| 4,118,869 | 10/1978 | Hartung | 33/174 TA |
| 4,344,160 | 8/1982 | Gabriel et al. | 367/96 |
| 4,420,233 | 12/1983 | Nomoto et al. | 353/122 |
| 4,431,304 | 2/1984 | Mayer | 355/53 X |
| 4,444,492 | 4/1984 | Lee | 355/55 |

Primary Examiner—Harry N. Haroian
Attorney, Agent, or Firm—Fitzpatrick, Cella, Harper & Scinto

[57] ABSTRACT

An alignment and exposure apparatus including a mask chuck for holding a mask, a wafer chuck for holding a wafer, a projection optical system for projecting the image of the mask onto the wafer, a non-contact distance measuring gauge for measuring the distance from a reference position to the wafer without contacting the wafer, a processing unit for calculating, on the basis of the measured distance, data on the position within the depth of field of the projection optical system and to be assumed by the mask, and an adjusting unit for adjusting the position of the mask in the direction of optical axis in accordance with an output from the processing unit so as to meet the data calculated by the processing unit, whereby the mask pattern is correctly focused on the wafer in the non-contact process with respect to the wafer surface.

38 Claims, 1 Drawing Figure

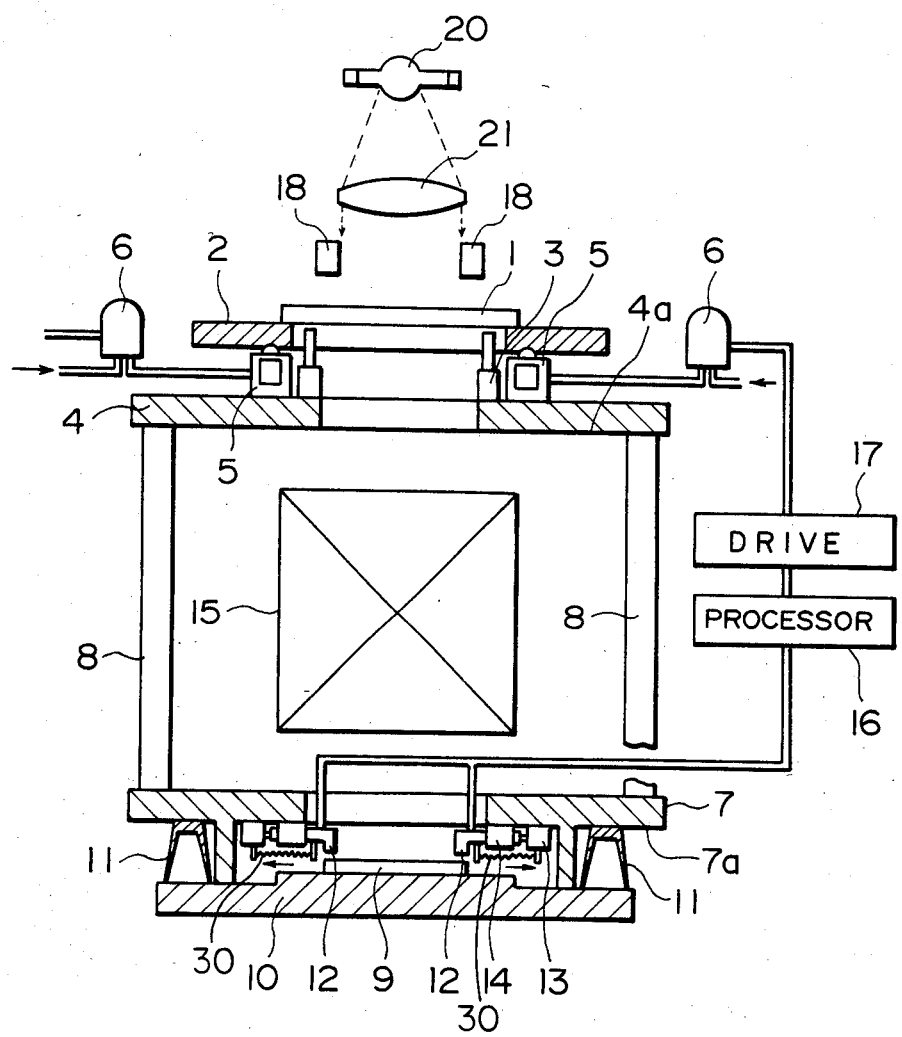
F I G. I

FOCUS ADJUSTMENT IN AN ALIGNMENT AND EXPOSURE APPARATUS

BACKGROUND OF THE INVENTION

This invention relates generally to an alignment and exposure apparatus for use in the manufacture of semiconductor devices, and more particularly to focus adjustment in an alignment and exposure apparatus of the projection exposure type.

In order to meet the recent demands for further miniaturization and higher integration of circuit patterns of large scaled integrated devices (LSI) or very large scaled integrated devices (VLSI), there has already been proposed an alignment and exposure apparatus of the projection type wherein a projection optical system is employed to project the image of a circuit pattern formed on a photomask or reticle onto a wafer for exposure thereof. This type of alignment and exposure apparatus can be generally classified into two types: one is a reduction projection system wherein the image of a reticle having one or more master patterns is projected onto a part of a wafer through a lens system with a predetermined demagnification (reduced scale), and by a step-and-repeat process, the entire surface of the wafer is successively exposed; and the other is a mirror projection system wherein a fixed mirror imaging optical system is employed to project the image of a region of a photomask held by a photomask holder onto a wafer held by a wafer holder, and, while effecting the exposure, the photomask holder and the wafer holder are moved as a unit relative to the mirror imaging optical system so that the image of the entire region of the photomask is projected onto the entire surface of the wafer for exposure thereof.

One of the important features to be possessed by these alignment and exposure apparatuses is a resolving power required for accurate reproduction of the image of the photomask or reticle (which will hereinafter be referred to simply as a "mask") on the wafer surface. The term "resolving power" means the resolution characteristics of the apparatus which is an index of how fine a pattern can be reproduced during exposure of the wafer to the mask pattern.

This resolving power of the projection type alignment and exposure apparatus is determined by various factors. Major ones of these factors are fundamental characteristics of the projection optical system such as an effective F-number (Fe) and a numerical aperture (NA), and accuracy and assembling precision of various optical elements such as lenses and mirrors. Moreover, the degree of stabilization of the focal distance including the optical system between the mask and wafer is also one of the major factors. Since, in general, the depth of focus of the projection optical system is of the order of several micron millimeters, focusing must be precisely achieved. In addition thereto, it is also very important that the focusing is achieved over the entire wafer surface, since there may be unevenness in the thickness or surface flatness of the wafer.

Usually, the focusing or focus adjustment has been achieved in this type of alignment and exposure apparatus by, first, correcting any warp of the wafer from behind with the use of a super-flat plate (or a wafer chuck) having a flatness-correction function, and by, second, moving the wafer so that the upper surface thereof is brought into abutment with three projections formed on a reference surface of a wafer disk which is located at a determined distance from the mask, whereby the wafer is positioned in its place. This technique has however some disadvantages. That is, when the wafer abuts against the projections, an adhesive photoresist applied to the wafer surface will be adhered to the protrusions formed on the reference surface. The amount of resist adhesion will increase with the increase in number of the wafers processed to make the distance between the mask and wafer unstable, which results in the possibility of defocus. Further, the areas on the wafer which are in contact with the three projections formed on the reference surface are not exposed to the mask pattern, which results in a poor yield of the semiconductor devices.

There has also been proposed a non-contact focusing technique such as disclosed in Japanese Laid-Open patent application No. 1229/1982 or U.S. Pat. No. 4,344,160. According to this technique, the wafer is kept out of contact with the reference surface, and, alternatively, a displacement gauge is employed to measure the distance between the reference surface and the wafer so that the wafer is moved toward or away from the reference surface by a distance corresponding to the difference between the measured value and a predetermined value. In this technique, however, a mechanism for displacing the wafer must be incorporated into the wafer chuck, so that the structure of the wafer chuck is complicated.

Moreover, if the alignment and exposure apparatus is arranged so that a plurality of wafer chucks are provided on a moving mechanism, such as a turntable, so that, during exposure of one wafer, loading, unloading, positioning or the like of the other wafers are performed in order to increase the throughput, the alignment and exposure apparatus must include a plurality of focusing mechanisms for the respective wafer chucks. This leads to a substantial increase in the manufacturing cost.

SUMMARY OF THE INVENTION

It is accordingly a primary object of the present invention to provide a device and a method for ensuring high resolution reproduction, on a wafer, of a semiconductor integrated circuit pattern formed on a mask.

Another object of the present invention is to provide a device and a method for ensuring that the surface of a wafer is positioned within the depth of focus of a projection optical system without contacting the wafer surface.

A further object of the present invention is to provide a device and a method for ensuring that the surface of a wafer is positioned within the depth of focus of a projection optical system even if the wafer surface is inclined or uneven due to any lack of uniformity in the thickness of a wafer.

A still further object of the present invention is to provide a device and a method for adjusting the position of a mask so that the entire surface of a wafer is positioned within the depth of focus of a projection optical system even if the wafer surface is inclined three-dimensionally.

These and other objects, features and advantages of the present invention will become more apparent upon a consideration of the following description of the preferred embodiments of the present invention taken in conjunction with the accompanying drawing.

BRIEF DESCRIPTION OF THE DRAWING

FIG. 1 is a cross-sectional view showing an embodiment of an alignment and exposure apparatus according to an aspect of the present invention.

DESCRIPTION OF THE PREFERRED EMBODIMENT

Referring now to FIG. 1, a mask 1 is held by vacuum or the like on a mask chuck 2 which rests on at least three pneumatically operated actuators 5. Each of the actuators 5 comprises a metallic bellows or diaphragm and is connected to an associated one of servo valves 6 of the flow-rate controllable type. The servo valves 6 are connected to an air pressure source (not shown), and the air pressure is controlled by a servo valve driving device 17 which will be described hereinafter. Each actuator 5 has an upper portion which is adapted to be moved upwardly or downwardly with a high precision (of the order of not more than 1 micron millimeter) by the air pressure supplied from the servo valve 6. The actuators 5 are fixed on a mask stage 4. The alignment and exposure apparatus also includes at least three air micrometers 3 with nozzles for measuring the distance between the lower surface of the mask 1, i.e. a circuit-pattern-bearing face of the mask 1, and the lower surface of the stage 4, i.e. a reference surface denoted at 4a in FIG. 1. The air micrometers 3 are disposed circumferentially and equiangularly with respect to each other, and each of the air micrometers 3 is radially aligned on the mask stage 4 with an associated one of the actuators 5. As is known, an air micrometer discharges a gas such as air and detects the back pressure of the discharged gas to detect the distance or spacing with high precision.

The mask stage 4 is connected to a wafer stage 7 by connecting rods 8 each made of a low expansion material such as invar. The lower surface, i.e. the reference surface 4a of the mask stage 4 is maintained parallel to the lower surface of the wafer stage 7, i.e. a reference surface denoted at 7a in FIG. 1.

On the reference surface 7a of the wafer stage 7, there are provided at least three air micrometers 12 disposed circumferentially and equiangularly with respect to each other. Each air micrometer has a nozzle which is adapted to be moved radially with respect to the wafer by a piston of an air cylinder 13 extending through a bearing 14 fixed to the reference surface 7a of the wafer stage 7. On the reference surface 7a, there are also provided at lease three rubber suction cups 11. The suction cups 11 are connected to the reference surface 7a and are adapted to hold by suction a wafer chuck 10 carrying the wafer 9. The alignment and exposure apparatus also includes stationary imaging optics of a reduction projection lens system or mirror projection system, which is schematically illustrated in the drawing at 15.

In the illustrated embodiment, the nozzle of each of the air micrometers 12 on the wafer side is radially aligned with an associated one of the air micrometers 3 and with an associated one of the actuators 5 on the mask side. If the imaging optics 15 comprise a mirror system and the pattern of the mask 1 is projected in inverted form, with respect to the optical axis, onto the wafer 9, the air micrometers 12 and their nozzles are disposed in an opposite positional relation relative to the air micrometers 3 and acutators 5 with respect to the optical axis. It is easily understood that the greater the number of air micrometers 3, 12 and actuators 5, the more the focusing precision in the apparatus is improved.

The wafer 9 is held on the wafer chuck 10 below the wafer stage 7, while any warp thereof is corrected from behind by the wafer chuck with the use of vacuum or the like. The wafer 9 is moved into alignnment with the pattern of the mask 1 through a moving mechanism (not shown). The wafer moving mechanism may comprise a turntable having thereon a plurality of wafer chucks as is known in the art.

Each of the upper surface of the mask chuck 2, upper surface and lower surface (reference surface) 4a of the mask stage 4, lower surface (reference surface) 7a of the wafer stage 7 and upper surface of the wafer chuck 10 is finished into a super-flat plane (usually, of the surface precision of the order of not more than 1 micron millimeter).

The alignment and exposure apparatus further includes a processing unit 16 such as a microcomputer in which a predetermined distance which falls within the depth of focus of the projection optical system 15 (for example the object-to-image distance) is stored. The processing unit 16 compares the output signal supplied from each air micrometer 12 with the stored reference value to calculate the difference therebetween, and outputs a signal to the driving unit 17 for the servo valves 6. In response to the signal supplied from the processing unit 16, the driving unit 17 actuates the servo valves 6 so that they are opened to supply the air pressure to the respective actuators 5 connected thereto.

In operation, the wafer 9 is moved to a position just below the imaging optical system 15 while being subjected to flatness-correction from behind by the wafer chuck 10 with the use of suction or the like. The wafer chuck 10 thus holding the wafer 9 is drawn by the suction cups 11 so that it is brought into abutment with the reference surface 7a and is positioned in its place. Then, the distance between the reference surface 7a and the upper surface of the wafer 9 is measured by using air micrometers 12. If the thickness of the wafer 9 is uneven or the warp of the wafer 9 has not been completely corrected, air micrometers 12 produce outputs of different values. As described hereinbefore, the processing unit 16 compares these measurement values with the reference value stored therein and provides current signals corresponding to the differences between the measurement values and the reference value. Each of the thus produced current signals is applied to the corresponding servo valve driving unit 17. In response to the applied current signal, the driving unit 17 actuates the servo valve 6 so as to supply the air pressure corresponding to the current signal to the actuator 5 to move the upper portion thereof upwardly or downwardly. In this manner, the deviation of the upper surface of the wafer 9 in the direction of optical axis and with respect to the predetermined imaging plane is corrected by the upward/downward movement of the mask 1 in the direction of the optical axis, whereby focus adjustment is achieved. The movement of the mask 1 is precisely controlled by controlling the servo valves 6 while monitoring the distance between the lower, patterned face of the mask 1 and the reference surface 4a through air micrometers 3. Where the alignment and exposure apparatus includes a bi-telecentric projection optical system and if the distance between the mask and wafer is maintained constant, any slight variation in the absolute position of the mask or wafer relative to the projection optical system will not cause defocus. The amount of movement of the mask 1 for focus adjustment, if the alignment and exposure apparatus is of the reduction projection type, is $$dw/M^2$$

wherein M is the reducing scale (demagnification) and dw is the amount of deviation of the wafer 9.

Where the alignment and exposure apparatus is of the unit magnification mirror projection type (i.e. M=1), the amount of movement of the mask 1 for focus adjustment is equal to the amount of deviation of the wafer 9.

The alignment and exposure apparatus according to the illustrated embodiment of the present invention further comprises an alignment observation system including a microscope disposed above the mask 1. For the simplicity of illustration, only objective lenses 18 of the microscope are shown in the drawing. These objective lenses 18 are movable in the direction of the optical axis in response to the movement of the mask 1 to achieve focusing of the microscope.

Upon completion of the focus adjustment of the alignment and exposure apparatus as described hereinbefore, the micrometers 12 for the wafer 9 are moved radially outwardly under the bias of tension springs 30 acting on the pistons of the cylinders 13, so that the micrometers 12 are moved out of the field of projection. Subsequently, the mask 1 is illuminated by the light beams emitted from a light source 20 of the alignment and exposure apparatus through a condenser lens 21, so that the pattern of the mask 1 is transferred onto the wafer 9 through the projection optical system 15.

While, in the above-described embodiment, the amount of movement of the mask 1 and the amount of deviation of the wafer 9 are detected by air micrometers, the present invention is not limited thereto and the air micrometers can be replaced by electric micrometers of the capacitance type for detecting the distance on the basis of the dielectric constant of air and the area of measurement. Since, in either of these cases, the measurement is achieved by a non-contact process, the mask and wafer would not be damaged. Further, the adhesion of the wafer photoresist is prevented, as compared with the case of the contact process measurement. It is understood that the pneumatically operated actuator for driving the mask in the illustrated embodiment can be replaced by stacked piezoelectric elements or a pulse motor for screw drive. High precision focusing is possible with any of these means.

In accordance with the present invention, as has hitherto been described, any defocus on the wafer side is corrected by moving the mask to thereby achieve focus adjustment. Therefore, it is no longer necessary to incorporate a complicated mechanism into the wafer chuck. This is particularly effective in an alignment and exposure apparatus having a plurality of wafer chucks. Since the wafer position detecting means of the non-contact type is employed, any defocus which may be caused by the deposition of the photoresist onto the wafer-side reference surface is prevented. Moreover, the wafer position detecting means is moved out of the field of projection during exposure, which ensures high yield of manufacture of semiconductors.

While the invention has been described with reference to the structures disclosed herein, it is not confined to the details set forth and this application is intended to cover such modifications or changes as may come within the purposes of the improvements or the scope of the following claims.

What is claimed is:

1. An alignment and exposure apparatus for use with a mask and a wafer, comprising:
   means for holding the mask;
   means for holding the wafer;
   projection exposure means, having an imaging characteristic, for projecting the image of the mask onto the wafer for exposure thereof;
   non-contact measuring means for measuring the distance from a reference position to the wafer without contacting the wafer;
   means for determining a mask position adjusting value on the basis of the measured distance measured by said measuring means and the imaging characteristic of said projection exposure means, and for producing an adjusting signal representative thereof;
   means responsive to the adjusting signal produced by said adjusting value determining means for adjusting the position of the mask in accordance with the adjusting value determined by said adjusting value determining means; and
   observation means for obtaining alignment between the mask and the wafer, said observation means being moved in the direction of the optical axis of said projection exposure means in response to said adjustment of the position of the mask by said adjusting means.

2. An alignment and exposure apparatus according to claim 1, wherein said non-contact measuring means comprises a gas micrometer.

3. An alignment and exposure apparatus according to claim 2, wherein said non-contact measuring means comprises at least three gas micrometers disposed equiangularly with respect to each other.

4. An alignment and exposure apparatus according to claim 1, wherein said non-contact measuring means comprises a non-contact electric micrometer.

5. An alignment and exposure apparatus according to claim 1, wherein said adjusting means comprises at least three expansible and contractable members which are expansible and contractable in the direction of the optical axis of said projection exposure means independently from each other.

6. An alignment and exposure apparatus according to claim 5, wherein said expansible and contractable members are disposed equiangularly with respect to each other.

7. An alignment and exposure apparatus according to claim 5, wherein each of said expansible and contractable members comprises a fluid actuator.

8. An alignment and exposure apparatus according to claim 7, wherein said fluid actuator comprises a bellows.

9. An alignment and exposure apparatus according to claim 7, wherein said fluid actuator comprises a diaphragm.

10. An alignment and exposure apparatus according to claim 5, wherein each of said expansible and contractable members comprises stacked piezoelectric elements.

11. An alignment and exposure apparatus according to claim 1, further comprising mask position detecting means for detecting the position of the mask and supplying said adjusting value determining means with a signal related to the current position of the mask.

12. An alignment and exposure apparatus according to claim 11, wherein said mask position detecting means comprises a gas micrometer.

13. An alignment and exposure apparatus according to claim 1, wherein said adjusting value determining means determines the adjusting value so that the wafer surface including any unevenness and within the range of imaging field of the mask is positioned within the depth of focus of said projection optical means.

14. An alignment and exposure apparatus according to claim 13, wherein said projection exposure means comprises a mirror projection system.

15. An alignment and exposure apparatus according to claim 13, wherein said projection optical means comprises a reduction lens projection system.

16. A method of focus adjustment in an alignment and exposure apparatus having a projection exposure system for projecting the image of a mask onto a wafer for exposure thereof, said method comprising the steps of:
holding the mask;
holding the wafer;
measuring the distance from a reference image plane of the projection exposure system to the surface of the wafer without contacting the wafer;
calculating a mask position correcting value on the basis of the measured distance and a characteristic of the projection exposure system;
adjusting the position of the mask to meet the calculated correcting value; and
moving an observation system, provided for obtaining alignment between the mask and the wafer, in a direction of the optical axis of the projection exposure system in response to the adjustment of the position of the mask.

17. A method according to claim 16, wherein the characteristic of the projection exposure system is $1/M^2$ where M is the magnification of the projection optical system and M can be equal to 1.

18. A method according to claim 16, wherein said adjusting step is carried out while detecting the current position of the mask.

19. A method according to claim 16, wherein the distance between the wafer surface and the reference image plane is measured at least at three points from which respective correcting values can be calculated in said calculating step, and wherein the mask position is adjusted in the direction of the optical axis at adjusting points corresponding to the measuring points, by respective amounts corresponding to the respective correcting values.

20. An alignment and exposure apparatus for use with a mask and a plurality of wafers, comprising:
means for holding the mask;
plural means respectively for holding the wafers and for selectively setting the wafers for exposure to an image of the mask;
projection exposure means, having an imaging characteristic, for projecting the image of the mask onto a selected one of the wafers for exposure thereof;
non-contact measuring means for measuring the distance from a reference position to the selected one of the wafers without contacting that wafer;
means for determining a mask position adjusting value on the basis of the measured distance measured by said measuring means and the imaging characteristic of said projection exposure means, and for producing an adjusting signal representative thereof; and
means responsive to the adjusting signal produced by said adjusting value determining means for adjusting the position of the mask in accordance with the adjusting value determined by said adjusting value determining means.

21. An alignment and exposure apparatus according to claim 20, wherein said non-contact measuring means comprises a gas micrometer.

22. An alignment and exposure apparatus according to claim 21, wherein said non-contact measuring means comprises at least three gas micrometers disposed equiangualarly with respect to each other.

23. An alignment and exposure apparatus according to claim 20, wherein said non-contact measuring means comprises a non-contact electric micrometer.

24. An alignment and exposure apparatus according to claim 20, wherein said adjusting means comprises at least three expansible and contractable members which are expansible and contractable in the direction of the optical axis of said projection exposure means independently from each other.

25. An alignment and exposure apparatus according to claim 24, wherein said expansible and contractable members are disposed equiangularly with respect to each other.

26. An alignment and exposure apparatus according to claim 24, wherein each of said expansible and contractable members comprises a fluid actuator.

27. An alignment and exposure apparatus according to claim 26, wherein said fluid actuator comprises a bellows.

28. An alignment and exposure apparatus according to claim 26, wherein said fluid actuator comprises a diaphragm.

29. An alignment and exposure apparatus according to claim 24, wherein each of said expansible and contractable members comprises stacked piezoelectric elements.

30. An alignment and exposure apparatus according to claim 20, further comprising mask postion detecting means for detecting the position of the mask and supplying said adjusting value determining means with a signal related to the current position of the mask.

31. An alignment and exposure apparatus apparatus according to claim 30, wherein said mask position detecting means comprises a gas micrometer.

32. An alignment and exposure apparatus according to claim 20, wherein said adjusting value determining means determines the adjusting value so that the wafer surface including any unevenness and within the range of imaging field of the mask is positioned within the depth of focus of said projection optical means.

33. An alignment and exposure apparatus according to claim 32, wherein said projection exposure means comprises a mirror projection system.

34. An alignment and exposure apparatus according to claim 32, wherein said projection optical means comprises a reduction lens projection system.

35. A method of focus adjustment in an alignment and exposure apparatus having a projection exposure system for projecting an image of a mask onto each of plural wafers for exposure thereof, said method comprising the steps of:
holding the mask;

holding, with plural holding means, the wafers to be selectively set for exposure to the image of the mask;

measuring the distance from a reference image plane of the projection exposure system to the surface of a selected one of the waters without contacting that wafer;

calculating a mask position correcting value on the basis of the measured distance and a characteristic of the projection exposure system; and adjusting the position of the mask to meet the calculated correcting value.

36. A method according to claim 35, wherein the characteristic of the projection exposure system is $1/M^2$ where M is the magnification of the projection optical system and M can be equal to 1.

37. A method according to claim 35, wherein said adjusting step is carried out while detecting the current position of the mask.

38. A method according to claim 35, wherein the distance between the wafer surface and the reference image from which respective correcting values can be calculated in said calculating step plane is measured at least at three points, and the mask position is adjusted in the direction of the optical axis at adjusting points corresponding to the measuring points, by respective amounts corresponding to the respective correcting values.

* * * * *

UNITED STATES PATENT AND TRADEMARK OFFICE
CERTIFICATE OF CORRECTION

PATENT NO. : 4,601,560
DATED : July 22, 1986
INVENTOR(S) : JUNJI ISOHATA, ET AL.

It is certified that error appears in the above-identified patent and that said Letters Patent is hereby corrected as shown below:

Column 3, line 66, change "acutators" to --actuators--
Column 4, line 6, change "alignnment" to --alignment--
Column 8, line 14, change "equiangualarly" to --equiangularly--
Column 8, line 47, delete "apparatus" (first occurrence)

Signed and Sealed this

Seventeenth Day of February, 1987

Attest:

DONALD J. QUIGG

Attesting Officer

Commissioner of Patents and Trademarks